US 6,342,674 B1

United States Patent
Liu et al.

(12) United States Patent
(10) Patent No.: US 6,342,674 B1
(45) Date of Patent: Jan. 29, 2002

(54) DOUBLE-LAYERED COMPUTER ENCLOSURE

(75) Inventors: Yu-Tai Liu, Hsin-Chuang; Yun-Lung Chen, Chung-Ho; Alvin Liu, Pa-Li, all of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/366,159

(22) Filed: Aug. 3, 1999

(30) Foreign Application Priority Data

Dec. 28, 1998 (TW) ........................ 87221645 U

(51) Int. Cl.[7] .............................. H05K 9/00; H05K 7/14
(52) U.S. Cl. ...................... 174/35 R; 361/799; 361/800; 361/816; 361/818
(58) Field of Search ................... 174/35 R, 35 GC, 174/35 MS; 361/800, 779, 816, 818, 683, 684, 686, 753, 796, 724, 727; 312/223.2

(56) References Cited

U.S. PATENT DOCUMENTS

| | | | | |
|---|---|---|---|---|
| 5,029,254 A | * | 7/1991 | Stickney | 174/35 GC |
| 5,164,886 A | * | 11/1992 | Chang | 361/390 |
| 5,383,096 A | * | 1/1995 | Benson et al. | 361/816 |
| 5,436,802 A | * | 7/1995 | Trahan et al. | 361/816 |
| 5,742,003 A | * | 4/1998 | Ho | 174/35 R |
| 5,783,771 A | * | 7/1998 | Copeland et al. | 174/35 R |
| 5,886,879 A | * | 3/1999 | Matuschik | 361/818 |
| 5,971,506 A | * | 10/1999 | Dubin | 312/223.2 |

* cited by examiner

*Primary Examiner*—Dean A. Reichard
*Assistant Examiner*—Carmelo Oliva
(74) *Attorney, Agent, or Firm*—Wei Te Chung

(57) ABSTRACT

A computer enclosure includes an outer casing having at least a bottom plate and a first front plate. A number of first tabs are formed on the first front plate. Each first tab is associated with an opening defined in the first front plate. An inner casing is received in the outer casing and is movably supported on the bottom panel. The inner casing has at least a second front plate abutting against the first front plate of the outer casing. Second tabs are formed on the second front plate for being received in the openings of the outer casing and abutting against the corresponding first tabs for positioning the inner casing with respect to the outer casing and establishing a grounding path therebetween. The openings of the outer casing are shielded by the second front plate of the inner casing thereby preventing leakage of electromagnetic radiation therethrough.

13 Claims, 4 Drawing Sheets

DOUBLE-LAYERED COMPUTER ENCLOSURE

BACKGROUND OF THE INVENTION

1. Field of the Invention

The present invention generally relates to a computer enclosure, and in particular to a computer enclosure having a double-layered structure for providing excellent electromagnetic interference (EMI) protection and mechanical properties.

2. The Prior Art

A personal computer comprises an enclosure for accommodating computer components therein. The computer enclosure comprises bottom, top, front, rear and side panels made from metal plates. Gaps may exist between adjacent panels through which leakage of electromagnetic radiation occurs, and long term exposure to electromagnetic radiation is known to be harmful. To overcome the problem of leakage of electromagnetic radiation, resilient metal members are interposed between adjacent panels for blocking the gaps. The resilient metal members increase costs and complicate manufacture of computer enclosures but may not be completely effective in reducing leakage of electromagnetic radiation. In addition, the front panel of a computer enclosure is usually formed with openings for mounting disk drives and ventilation holes for heat removal. Such openings and holes magnify the severity of the electromagnetic radiation problem. Techniques that are taken to address the radiation problem of a computer enclosure are disclosed in Taiwan Patent Application Nos. 74223527, 75227324, 71223379, 74211627 and 74223527 and U.S. Pat. Nos. 5,164,776, 5,031,070 and 5,491,610.

It is thus desired to provide a double-layered computer enclosure which effectively prevents leakage of electromagnetic radiation through a front panel thereof.

SUMMARY OF THE INVENTION

Accordingly, an object of the present invention is to provide a double-layered computer enclosure having excellent EMI protection and mechanical properties.

Another object of the present invention is to provide a computer enclosure having a double-layered front panel for reducing leakage of electromagnetic radiation through the front panel.

To achieve the above objects, in accordance with the present invention, a computer enclosure comprises an outer casing having at least a bottom plate and a first front plate. A number of first tabs is formed on the first front plate. Each first tab is associated with an opening defined in the first front plate. An inner casing is received in the outer casing and is movably supported on the bottom panel. The inner casing has at least a second front plate abutting against the first front plate of the outer casing. Second tabs are formed on the second front plate for being received in the openings of the outer casing and abutting against the corresponding first tabs for positioning the inner casing with respect to the outer casing and establishing a grounding path therebetween. The openings of the outer casing are shielded by the second front plate of the inner casing thereby preventing leakage of electromagnetic radiation therethrough.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
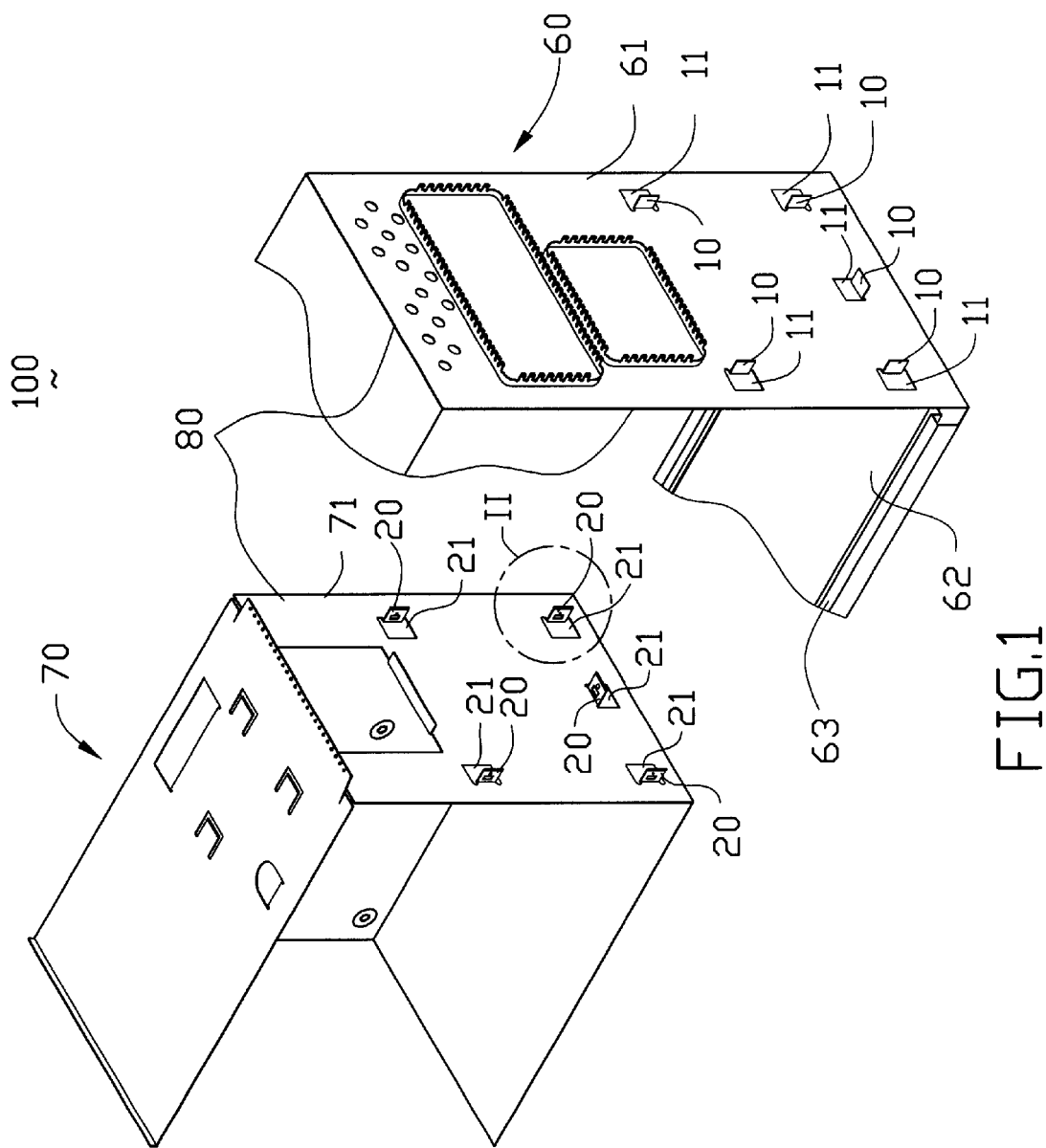
FIG. 1 is an exploded view of a portion of a computer enclosure constructed in accordance with the present invention.

Referring to the drawings and in particular to FIG. 1, a computer enclosure 100 constructed in accordance with the present invention comprises an inner casing 70 received in an outer casing 60. The outer casing 60 comprises at least a first front plate 61 and a bottom plate 62. A number of first perpendicular tabs 10 are stamped on the first front plate 61 thereby forming an equal number of openings 11 in the first front plate 61. Rails 63 are formed on the bottom plate 62 of the outer casing 60.

The inner casing 70 comprises at least a second front plate 71 on which a number of second perpendicular tabs 20 are formed corresponding to the first tabs 10 of the outer casing 60. In the embodiment illustrated, the second tabs 20 are formed by stamping thereby defining openings 21 in the second front plate 71.

Figure 3:
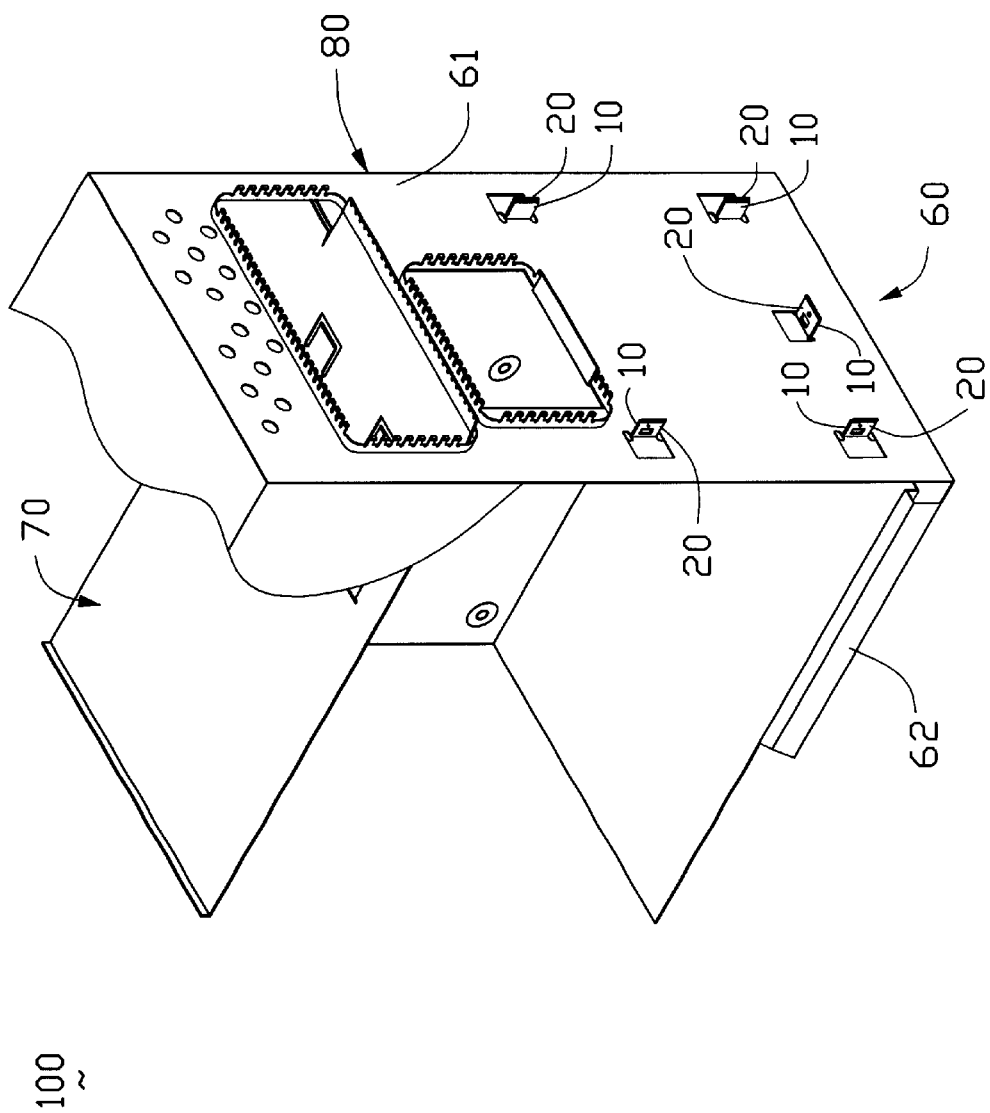
FIG. 3 is an assembled view of FIG. 1.
Figure 4:
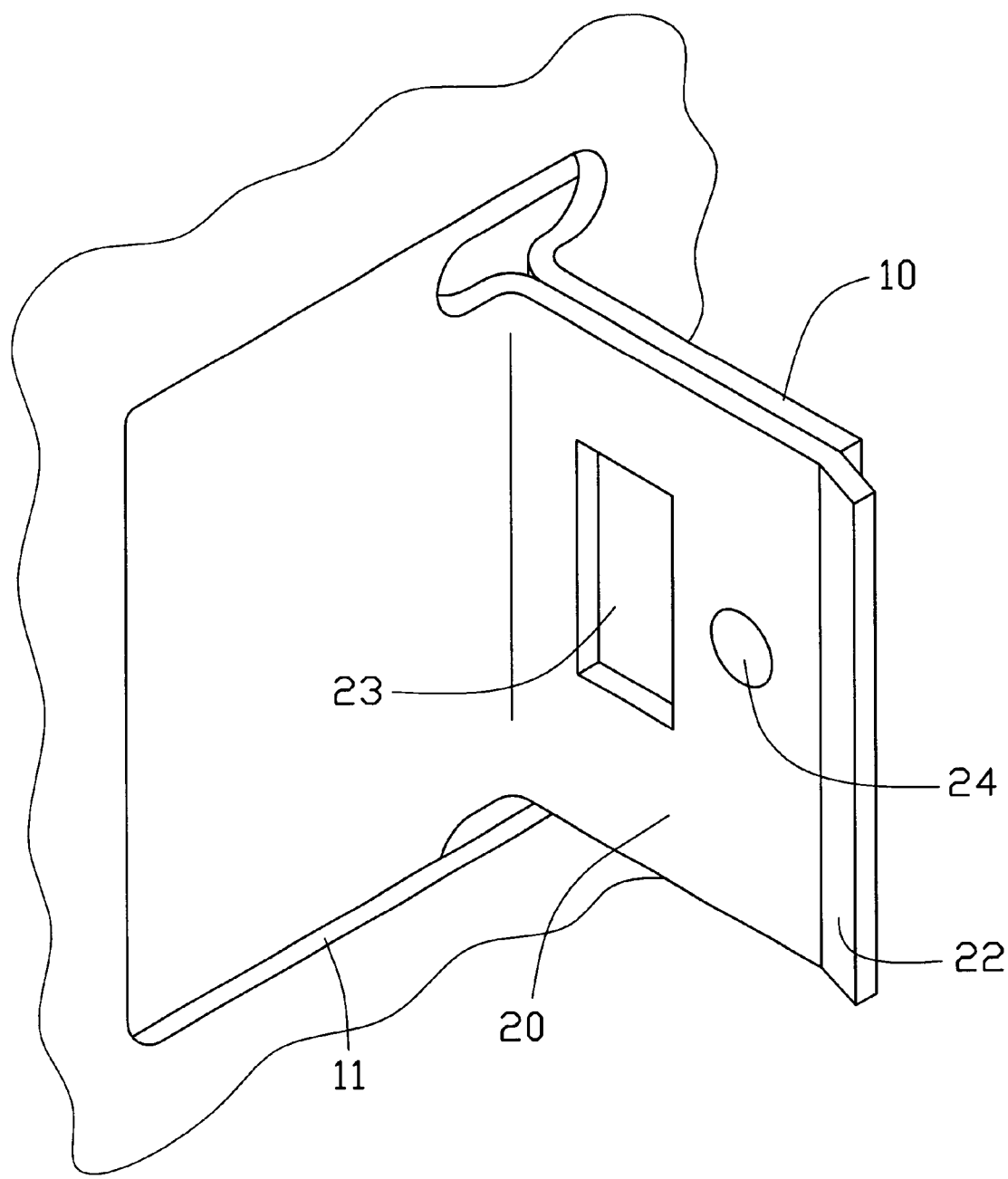
FIG. 4 is an enlarged view of a portion of the computer enclosure showing the spatial relationship between inner and outer casings.

The inner casing 70 is movably supported on the rails 63 whereby the second front plate 71 thereof may be moved toward and thus abut against the first front plate 61 of the outer casing 60 as shown in FIG. 3. The second tabs 20 are received in the openings 11 of the outer casing 60 and abut against the corresponding first tabs 10 as shown in FIG. 4 for properly positioning the inner casing 70 with respect to the outer casing 60. The first and second front plates 61, 71 together form a front panel 80 of the enclosure 100.

Figure 2:
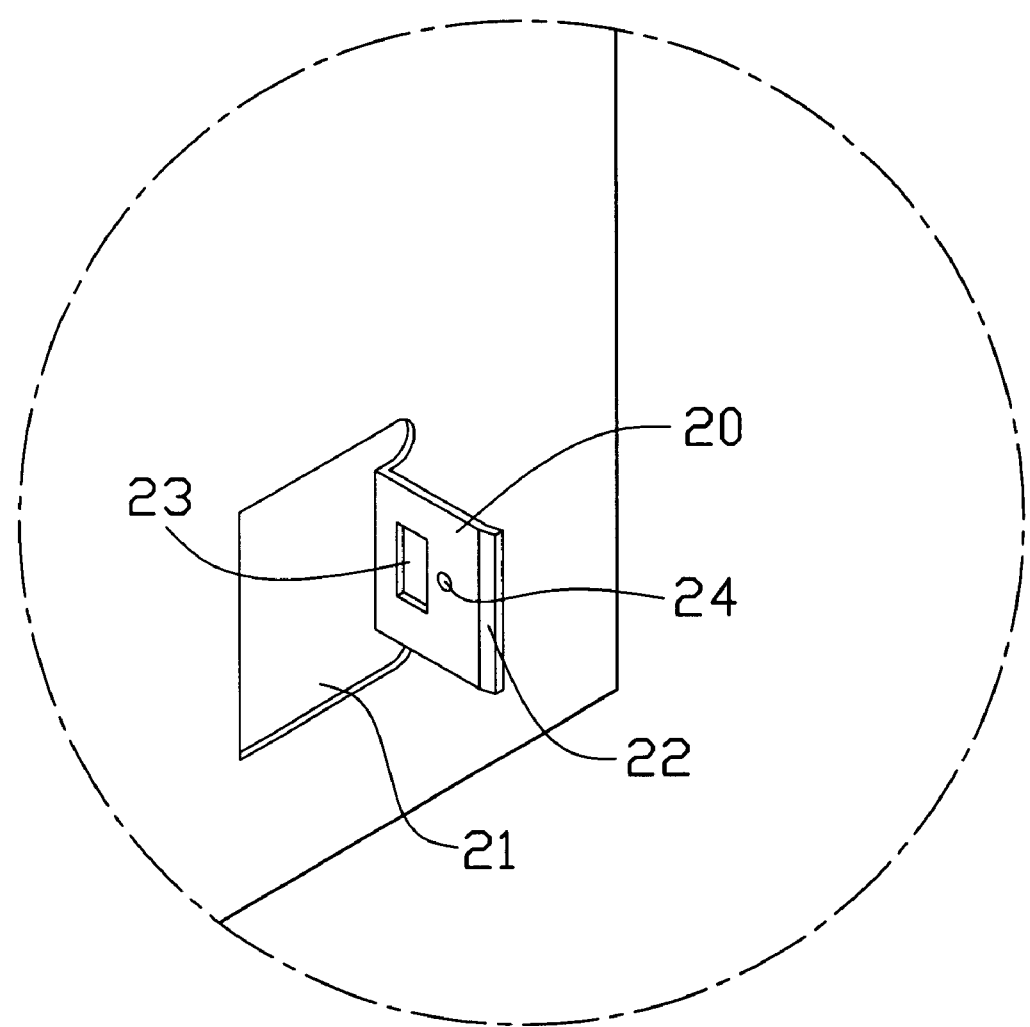
FIG. 2 is an enlarged view of encircled portion II of FIG. 1.

As shown in FIG. 2, each second tab 20 has an inclined edge 22 for engaging with the corresponding first tab 10 to guide the second tab 20 into the corresponding opening 11. A projection 24 is formed on each second tab 20 for contacting the corresponding first tab 11 thereby establishing a proper grounding path between the inner and outer casings 70, 60. Furthermore, an opening 23 is formed in each second tab 20 for providing compliance with the first tab 10 and ensuring proper engagement between the tabs 10, 20.

The first and second tabs 10, 20 are formed such that the openings 11, 21 thereof are offset with respect to each other whereby when the inner casing 70 is received in the outer casing 60, the openings 11, 21 are shielded by solid portions of the casings 60, 70, as shown in FIG. 4, for ensuring proper EMI protection and preventing leakage of electromagnetic radiation therethrough.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A computer enclosure comprising
a first casing having at least a first front plate and a bottom plate, a number of first tabs being perpendicularly formed on the first front plate, openings being defined in the first front plate corresponding to each first tab; and a second casing received in the first casing and supported on the bottom plate, the second casing having at least a second front plate abutting against the first front plate, second tabs being perpendicularly formed on the second front plate, the second tabs being received in the openings of the first front plate and abutting against the corresponding first tabs for positioning the second casing with respect to the first casing and establishing a grounding path therebetween.

2. The computer enclosure as claimed in claim 1, wherein rails are formed on the bottom plate of the first casing for movably supporting the second casing.

3. The computer enclosure as claimed in claim 1, wherein the openings of the first front plate are shielded by the second front plate.

4. The computer enclosure as claimed in claim 1, wherein each second tab has an inclined edge at an end thereof distal from the second front plate for guiding the second tab into the corresponding opening.

5. The computer enclosure as claimed in claim 4, wherein at least one projection is formed on each second tab for contacting the corresponding first tab to ensure proper engagement therebetween.

6. The computer enclosure as claimed in claim 1, wherein an opening is defined in each of the second tabs for ensuring proper engagement of the second tab with the corresponding first tab.

7. The computer enclosure as claimed in claim 1, wherein at least one projection is formed on each second tab for contacting the corresponding first tab to ensure proper engagement therebetween.

8. A computer enclosure comprising:

a first casing having a first front plate and a bottom plate, a number of first tabs being formed on the first front plate, openings being defined in the first front plate corresponding to each first tab; and a second casing being supported on the bottom plate of the first casing and having a second front plate abutting against the first front plate, second tabs being formed on the second front plate, the second tabs being received in the openings of the first front plate and abutting against the corresponding first tabs for positioning the second casing with respect to the first casing and establishing a grounding path therebetween.

9. The computer enclosure as claimed in claim 8, wherein rails are formed on the bottom plate of the first casing for movably supporting the second casing.

10. The computer enclosure as claimed in claim 8, wherein the openings of the first front plate are shielded by the second front plate.

11. The computer enclosure as claimed in claim 8, wherein each second tab has an inclined edge at an end thereof distant from the second front plate for guiding the second tab into the corresponding opening.

12. The computer enclosure as claimed in claim 8, wherein at least one projection is formed on each second tab for contacting the corresponding first tab to ensure proper engagement therebetween.

13. The computer enclosure as claimed in claim 8, wherein an opening is defined in each of the second tabs for providing compliance with the corresponding first tab.

* * * * *